(12) United States Patent
Wakabayashi

(10) Patent No.: US 8,108,808 B2
(45) Date of Patent: Jan. 31, 2012

(54) DESCRIPTION PROCESSING DEVICE, DESCRIPTION PROCESSING METHOD, AND RECORDING MEDIUM

(75) Inventor: Kazutoshi Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 428 days.

(21) Appl. No.: 12/408,209

(22) Filed: Mar. 20, 2009

(65) Prior Publication Data

US 2009/0249260 A1 Oct. 1, 2009

(30) Foreign Application Priority Data

Mar. 25, 2008 (JP) ................... 2008-079066

(51) Int. Cl.
*G06F 17/50* (2006.01)
(52) U.S. Cl. ......... 716/100; 716/101; 716/103; 716/104
(58) Field of Classification Search .................. 716/100, 716/101, 103, 104
See application file for complete search history.

(56) References Cited

U.S. PATENT DOCUMENTS

| 4,670,842 | A | * | 6/1987 | Metwaly | 715/256 |
| 7,302,656 | B2 | * | 11/2007 | Weber et al. | 716/103 |
| 7,512,728 | B2 | * | 3/2009 | Tseng | 710/100 |
| 7,937,559 | B1 | * | 5/2011 | Parameswar et al. | 712/37 |

FOREIGN PATENT DOCUMENTS

| JP | 1998233672 A | 9/1998 |
| JP | 2007272671 A | 10/2007 |

* cited by examiner

*Primary Examiner* — Sun Lin

(57) ABSTRACT

A receiving unit receiving a description expressing a finite state machine comprising states $0, 1, 2, \ldots, N-1$; a dividing unit dividing the states $0, 1, 2, \ldots, N-1$ into groups $0, 1, 2, \ldots, M-1$, wherein the dividing unit allocates the states $0, 1, \ldots, L[0]-1$ to the group 0, allocates the states $L[0], L[0]+1, \ldots, L[1]-1$ to the group 1, allocates the states $L[1], L[1]+1, \ldots, L[2]-1$ to the group 2, ..., and allocates the states $L[M-2], L[M-2]+1, \ldots, L[M-1]-1=N-1$ to the group $M-1$; and a generating unit generating a register transfer level description so that decoders which acquire the current state are generated for each group are provided.

4 Claims, 5 Drawing Sheets

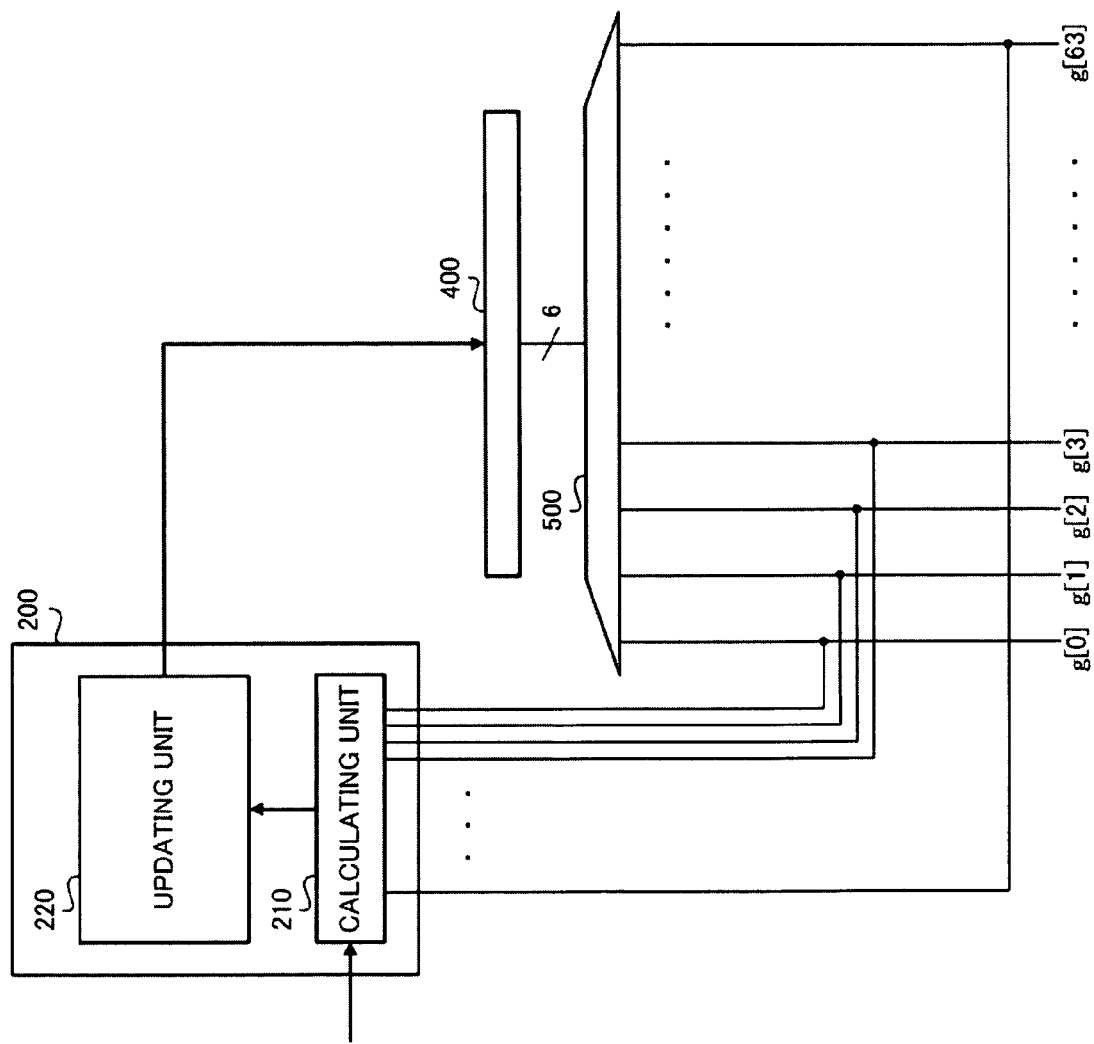

DESCRIPTION PROCESSING DEVICE, DESCRIPTION PROCESSING METHOD, AND RECORDING MEDIUM

This application is based on Japanese Patent Application No. 2008-079066 filed on Mar. 25, 2008 and including specification, claims, drawings and summary. The disclosure of the above Japanese Patent Application is incorporated herein by reference in its entirety.

BACKGROUND OF THE INVENTION

1. Field of the Invention

The present invention relates to a description processing device and a description processing method suitable for realizing an electronic circuit, which acquires the current state of a finite state machine at a high speed, and a recording medium recording a program for realizing the device and method on a computer.

2. Description of the Related Art

Because of advance in computer techniques, designing, analysis, evaluation, etc. of semiconductor integrated circuits has been commonly carried out by using a Computer-Aided Design (CAD) system having a behavioral synthesis tool and a logic synthesis tool. For example, Unexamined Japanese Patent Application KOKAI Publication No. 2007-272671 discloses a circuit design supporting system having a behavioral synthesis tool and a logic synthesis tool.

When a semiconductor integrated circuit is to be designed by using the circuit design supporting system, first, a designer prepares a behavior level description including the information necessary for hardware implementation of bit width, etc. of an input port and variables.

Next, by using the behavioral synthesis tool, the designer converts the behavior level description to a Register Transfer Level (RTL) description expressing the logics, which are to be implemented, by registers and logic functions between the registers. Then, the designer converts the RTL description to logic circuits of the gate level by using the logic synthesis tool.

Also in the case in which a semiconductor integrated circuit including a finite state machine, i.e., a state machine is to be designed, the semiconductor integrated circuit is designed by using the above described circuit design supporting system. The state machine is a counter which carries out special operations and comprises the combination of a flip-flop, which stores the current state, a next-state generating circuit, which generates the state to which a transition is to be made, and a state extraction circuit, which decodes tie state output of the flip-flop. The configuration of the state machine is disclosed in, for example, Unexamined Japanese Patent Application KOKAI Publication No. H10-233672.

The operation speed of the state machine affects the operation speed of the entire semiconductor integrated circuit materially. Therefore, the time which the state machine requires for decoding die current state is desired to be short as much as possible. Particularly, when a semiconductor integrated circuit having a state machine is to be automatically generated by using the design supporting system disclosed in Unexamined Japanese Patent Application KOKAI Publication No. 2007-272671, since the number of the states that can be implemented by the generated semiconductor integrated circuit is increased, techniques to carry out high-speed decoding has been desired.

SUMMARY OF THE INVENTION

In one aspect of the present invention, a description processing device has: a receiving unit, a dividing unit, and a generating unit and is constituted in the below described manner.

First, the receiving unit receives a description expressing a finite state machine comprising states $0, 1, 2, \ldots, N-1$.

Next, the dividing unit divides the states $0, 1, 2, \ldots, N-1$ into groups $0, 1, 2, \ldots, M-1$.

Furthermore, the dividing unit allocates the states $0, 1, \ldots, L[0]-1$ to the group 0, allocates the states $L[0], L[0]+1, \ldots, L[1]-1$ to the group 1, allocates the states $L[1], L[1]+1, \ldots, L[2]-1$ to the group 2, $\ldots$, and allocates the states $L[M-2], L[M-2]+1, \ldots, L[M-1]-1=N-1$ to the group $M-1$.

The generating unit generates a register transfer level description.

The register transfer level description expresses the elements described below.

(a) A register T storing information that to which group a current state belongs among the groups $0, 1, 2, \ldots, M-1$ and a decoder E outputting signals $t[0], t[1], t[2], \ldots, t[M-1]$ corresponding to each values which can be stored in the register T.

(b) A register $G[0]$ storing information that which one of the states $0, 1, \ldots, L[0]-1$ is the current state when the current state belongs to the group 0 and a decoder $D[0]$ outputting signals $s[0], s[1], \ldots, s[L[0]-1]]$ corresponding to each values which can be stored in the register $G[0]$.

A register $G[1]$ storing information that which one of the states $L[0], L[0]+1, \ldots, L[1]-1$ is the current state when the current state belongs to the group 1 and a decoder $D[1]$ outputting signals $s[L[0]], s[L[0]+1], \ldots, s[L[1]-1]]$ corresponding to each values which can be stored in the register $G[1]$.

A register $G[2]$ storing information that which one of the states $L[1], L[1]+1, \ldots, L[2]-1$ is the current state when the current state belongs to the group 2 and a decoder $D[2]$ outputting signals $s[L[1]], s[L[1]+1], \ldots, s[L[2]-1]$ corresponding to each values which can be stored in the register $G[2]$.

A register $G[M-1]$ storing information that which one of the states $L[M-2], L[M-2]+1, \ldots, L[M-1]-1=N-1$ is the current state when the current state belongs to the group $M-1$ and a decoder $D[M-1]$ outputting signals $s[L[M-2]], s[L[M-2]+1], \ldots, s[L[M-1]-1]$ corresponding to each values which can be stored in the register $G[M-1]$.

A logic circuit outputting signals $g[0], g[1], \ldots, g[L[0]-1]]$ from the respective signals $s[0], s[1], \ldots, s[L[0]-1]]$ and the signal $t[0]$, outputting signals $g[L[0]], g[L[0]+1], \ldots, g[L[1]-1]]$ from the respective signals $s[L[0]], s[L[0]+1], \ldots, s[L[1]-1]]$ and the signal $t[1]$, outputting signals $g[L[1]], g[L[1]+1], \ldots, g[L[2]-1]$ from the respective signals $s[L[1]], s[L[1]+1], \ldots, s[L[2]-1]$ and the signal $t[2], \ldots$, and outputting signals $g[L[M-2]], g[L[M-2]+1], \ldots, g[L[M-1]-1]$ from the respective signals $s[L[M-2]], s[L[M-2]+1], \ldots, s[L[M-1]-1]$ and the signal $t[M-1]$ so as to output the signals $g[0], g[1], g[2], \ldots, g[N-1]$ corresponding to each implementable states $0, 1, 2, \ldots, N-1$.

A transition circuit calculating a next state based on the signals $g[0], g[1], g[2], \ldots, g[N-1]$ and storing 0 in the register T and storing the next state in the register $G[0]$ when the next state belongs to the group 0, storing 1 in the register T and storing the next state in the register $G[1]$ when the next state belongs to the group 1, storing 2 in the register T and storing the next state in the register $G[2]$ when the next state belongs to the group $2, \ldots$, storing $M-1$ in the register T and storing the next state in the register G[M−1] when the next state belongs to the group M−1.

Another aspect of the present invention is a description processing method executed by a description processing device having a receiving unit, a dividing unit, and a generating unit, wherein the method includes a receiving step, a dividing step, and a generating step and is constituted in the manner described below.

Specifically, in the receiving step, the receiving unit receives a description expressing a finite state machine comprising states 0, 1, 2, . . . , N−1.

Then, in the dividing step, the dividing unit divides the states 0, 1, 2, . . . , N−1 into groups 0, 1, 2, . . . , M−1.

In addition, in the dividing step, the dividing unit allocates the states 0, 1, . . . , L[0]−1 to the group 0, allocates the states L[0], L[0]+1, . . . , L[1]−1 to the group 1, allocates the states L[1], L[1]+1, . . . , L[2]−1 to the group 2, . . . , and allocates the states L[M−2], L[M−2]+1, . . . , L[M−1]−1=N−1 to the group M−1.

Furthermore, in the generating step, the generating unit generates a register transfer level description, The register transfer level description expresses the elements described below.

(a) A register T storing information that to which group a current state belongs among the groups 0, 1, 2, . . . , M−1 and a decoder E outputting signals t[0], t[1], t[2], . . . , t[M−1] corresponding to each values which can be stored in the register T.

(b) A register G[0] storing information that which one of the states 0, 1, . . . , L[0]−1 is the current state when the current state belongs to the group 0 and a decoder D[0] outputting signals s[0], s[1], . . . , s[L[0]−1]] corresponding to each values which can be stored in the register G[0].

A register G[1] storing information that which one of the states L[0], L[0]+1, . . . , L[1]−1 is the current state when the current state belongs to the group 1 and a decoder D[1] outputting signals s[L[0]], s[L[0]+1], . . . , s[L[1]−1]] corresponding to each values which can be stored in the register G[1].

A register G[2] storing information that which one of the states L[1], L[1]+1, . . . , L[2]−1 is the current state when the current state belongs to the group 2 and a decoder D[2] outputting signals s[L[1]], s[L[1]+1], . . . , s[L[2]−1] corresponding to each values which can be stored in the register G[2].

A register G[M−1] storing information that which one of the states L[M−2], L[M−2]+1, . . . , L[M−1]−1=N−1 is the current state when the current state belongs to the group M−1 and a decoder D[M−1] outputting signals s[L[M−2]], s[L[M−2]+1], . . . , s[L[M−1]−1] corresponding to each values which can be stored in the register G[M−1].

A logic circuit outputting signals g[0], g[1], . . . , g[L[0]−1]] from the respective signals s[0], s[1], s[L[0]−1]] and the signal t[0], outputting signals g[L[0]], g[L[0]+1], . . . , g[L[1]−1]] from the respective signals s[L[0]], s[L[0]+1, . . . , s[L[1]−1]] and the signal t[1], outputting signals g[L[1]], g[L[1]+1], . . . , g[L[2]−1] from the respective signals s[L[1]], s[L[1]+1], . . . , s[L[2]−1] and the signal t[2], . . . , and outputting signals g[L[M−2]], g[L[M−2]+1], . . . , g[L[M−1]−1] from the respective signals s[L[M−2]], s[L[M−2]+1], . . . , s[L[M−1]−1] and the signal t[M−1] so as to output the signals g[0], g[1], g[2], . . . , g[N−1] corresponding to each implementable states 0, 1, 2, . . . , N−1.

A transition circuit calculating a next state based oil tile signals g[0], g[1], g[2], . . . , g[N−1] and storing 0 in the register T and storing the next state in the register G[0] when the next state belongs to the group 0, storing 1 in the register T and storing the next state in the register G[1] when the next state belongs to the group 1, storing 2 in the register T and storing the next state in the register G[2] when the next state belongs to the group 2, . . . , storing M−1 in the register T and storing the next state in the register G[M−1] when the next state belongs to the group M−1.

Another aspect of the present invention is a recording medium recording a computer-readable program, which causes a computer to function in the manner described below as a receiving unit, a dividing unit, and a generating unit.

First, the receiving unit receives a description expressing a finite state machine comprising states 0, 1, 2, . . . , N−1.

Next, the dividing unit divides the states 0, 1, 2, . . . , N−1 into groups 0, 1, 2, . . . , M−1.

Furthermore, the dividing unit allocates the states 0, 1, . . . , L[0]−1 to the group 0, allocates the states L[0], L[0]+1, . . . , L[1]−1 to the group 1, allocates the states L[1], L[1]+1, . . . , L[2]−1 to the group 2, . . . , and allocates the states L[M−2], L[M−2]+1, . . . , L[M−1]−1=N−1 to the group M−1.

The generating unit generates a register transfer level description.

The register transfer level description expresses the elements described below.

(a) A register T storing information that to which group a current state belongs among the groups 0, 1, 2, . . . , M−1 and a decoder E outputting signals t[0], t[1], t[2], . . . , t[M−1] corresponding to each values which can be stored in the register T.

(b) A register G[0] storing information that which one of the states 0, 1, . . . , L[0]−1 is the current state when the current state belongs to the group 0 and a decoder D[0] outputting signals s[0], s[1], . . . , s[L[0]−1]] corresponding to each values which can be stored in the register G[0].

A register G[1] storing information that which one of the states L[0], L[0]+1, . . . , L[1]−1 is the current state when the current state belongs to the group 1 and a decoder D[1] outputting signals s[L[0]], s[L[0]+1], . . . , s[L[1]−1]] corresponding to each values which can be stored in the register G[1].

A register G[2] storing information that which one of the states L[1], L[1]+1, . . . , L[2]−1 is the current state when the current state belongs to the group 2 and a decoder D[2] outputting signals s[L[1]], s[L[1]+1], . . . , s[L[2]−1] corresponding to each values which can be stored in the register G[2].

A register G[M−1] storing information that which one of the states L[M−2], L[M−2]+1, . . . , L[M−1]−1=N−1 is the current state when the current state belongs to the group M−1 and a decoder D[M−1] outputting signals s[L[M−2]], s[L[M−2]+1], . . . , s[L[M−1]−1] corresponding to each values which can be stored in the register G[M−1].

A logic circuit outputting signals g[0], g[1], . . . , g[L[0]−1]] from the respective signals s[0], s[1], . . . , s[L[0]−1]] and the signal t[0], outputting signals g[L[0]], g[L[0]+1], . . . , g[L[1]−1]] from the respective signals s[L[0]], s[L[0]+1], . . . , s[L[1]−1]] and the signal t[1], outputting signals g[L[1]], g[L[1]+1], . . . , g[L[2]−1] from the respective signals s[L[1]], s[L[1]+1], . . . , s[L[2]−1] and the signal t[2], . . . , and outputting signals g[L[M−2]], g[L[M−2]+1], . . . , g[L[M−1]−1] from the respective signals s[L[M−2]], s[L[M−2]+1], . . . , s[L[M−1]−1] and the signal t[M−1] so as to output the signals g[0], g[1], g[2], . . . , g[N−1] corresponding to each implementable states 0, 1, 2, . . . , N−1.

A transition circuit calculating a next state based on the signals g[0], g[1], g[2], . . . , g[N−1] and storing 0 in the register T and storing the next state in the register G[0] when the next state belongs to the group 0, storing 1 in the register T and storing the next state in the register G[1] when the next state belongs to the group 1, storing 2 in the register T and storing the next state in the register G[2] when the next state belongs to the group 2, . . . , storing M−1 in the register T and storing the next state in the register G[M−1] when the next state belongs to the group M−1.

BRIEF DESCRIPTION OF THE DRAWINGS

These objects and other objects and advantages of the present invention will become more apparent upon reading of the following detailed description and the accompanying drawings in which:

FIG. 5 is a diagram for explaining a finite state machine of the case in which implementable states are not divided into groups.

DETAILED DESCRIPTION OF THE PREFERRED EMBODIMENT

Hereinafter, a description processing device according to the present embodiment will be explained with reference to drawings.

First, the configuration of the description processing device 100 according to the present embodiment will be explained with reference to FIG. 1. The description processing device 100 is a device which generates Register Transfer level (RTL) descriptions describing the configuration, layout, and wiring of a semiconductor integrated circuit based on descriptions expressing a finite state machine comprising states 0, 1, 2, . . . , N−1.

The descriptions expressing the finite state machine comprising the states 0, 1, 2, . . . , N−1 are, for example, behavior level descriptions including the information necessary for hardware implementation of the bit width, etc. of an input port and variables, intermediate descriptions for obtaining the RTL descriptions from the behavior level descriptions, or the RTL descriptions per se. The description processing device 100 generates RTL descriptions expressing an electronic circuit which acquires the current state of the finite state machine at a high speed.

Figure 1:
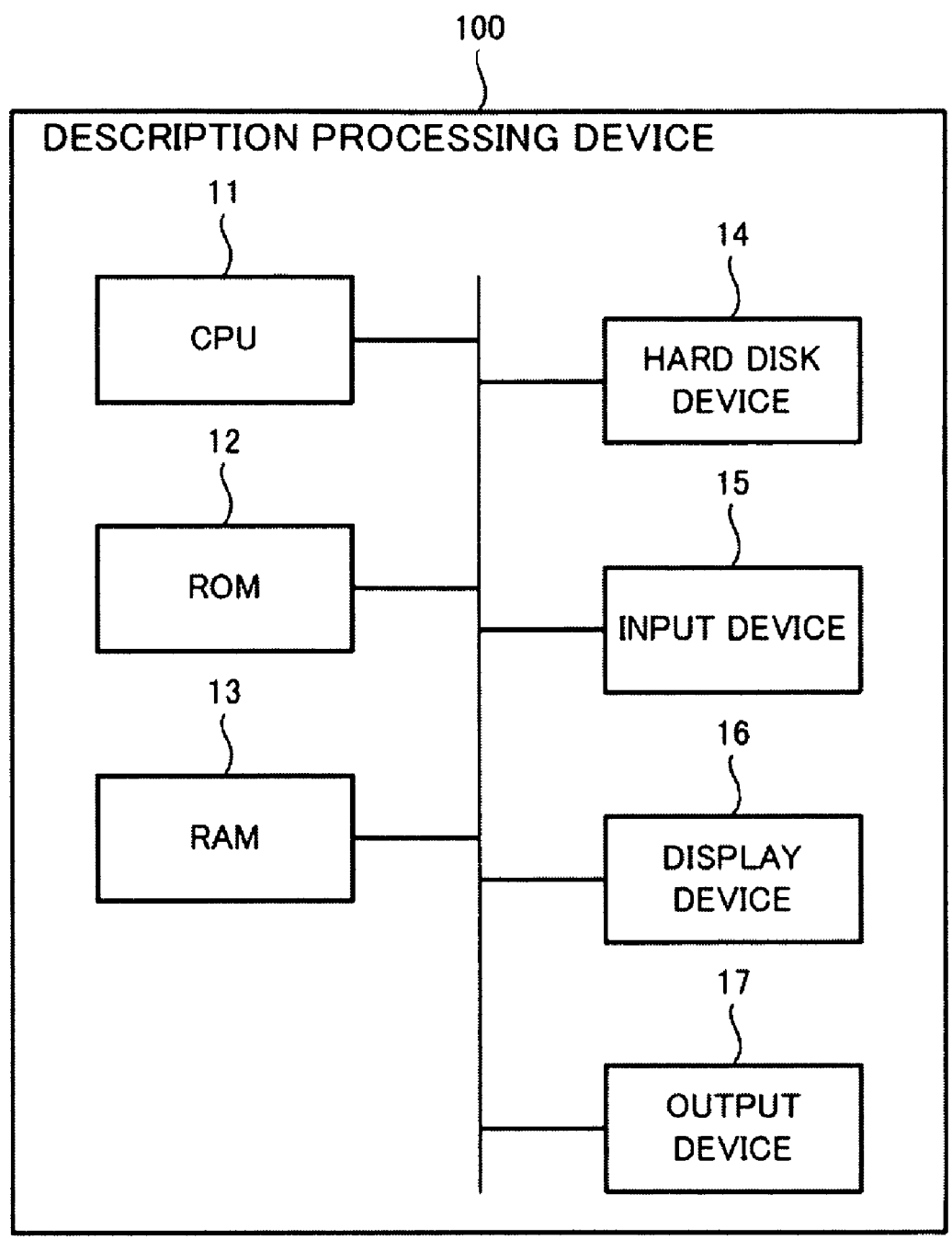
FIG. 1 is a block diagram showing a configuration of a description processing device according to an embodiment of the present invention.

As shown in FIG. 1, the description processing device 100 physically has: a Central Processing Unit (CPU) 11, a Read Only Memory (ROM) 12, a Random Access memory (RAM) 13, a hard disk device 14, an input device 15, a display device 16, and an output device 17. The constituent elements that the description processing device 100 has are mutually connected via a bus.

The CPU 11 controls overall operations of the description processing device 100 in accordance with the programs stored in the hard disk device 14. The CPU 11 is connected to the constituent elements via the bus and transmits and receives control signals and data.

The ROM 12 stores an Initial Program Loader (IPL), which is executed immediately after power is turned on. After the IPL is executed, the CPU 11 retrieves the programs stored in the hard disk device 14 to the RAM 13 and executes them.

The RAM 13 temporarily stores data and programs. The RAM 13 temporarily stores, for example, the program retrieved from the hard disk device 14 and the data necessary for a behavioral synthesis process.

The hard disk device 14 stores the program which is executed by the CPU 11. The hard disk device 14 also stores, for example, a behavior level description which is to be subjected to behavior synthesis and a RTL description obtained by the behavioral synthesis.

Under the control of the CPU 11, the input device 15 receives an input of, for example, parameters necessary for the behavioral synthesis from a user and receives requests such as an initiation request of the behavioral synthesis from the user. The input device 15 comprises, for example, a keyboard and a mouse.

Under the control of the CPU 11, the display device 16 displays: for example, a screen for receiving input of, for example, the parameters and requests such as the behavioral synthesis initiation request from the user; a screen for displaying the behavior level description; and a screen for displaying the RTL description. The display device 16 comprises, for example, a liquid crystal display device.

Under the control of the CPU 11, the output device 17 outputs, for example, the RTL description obtained by the behavioral synthesis. The output device 17 comprises, for example, a general-purpose communication interface, such as a USB port, and a digital output port.

Next, a basic configuration of the description processing device 100 according to the present embodiment will be explained.

Figure 2:
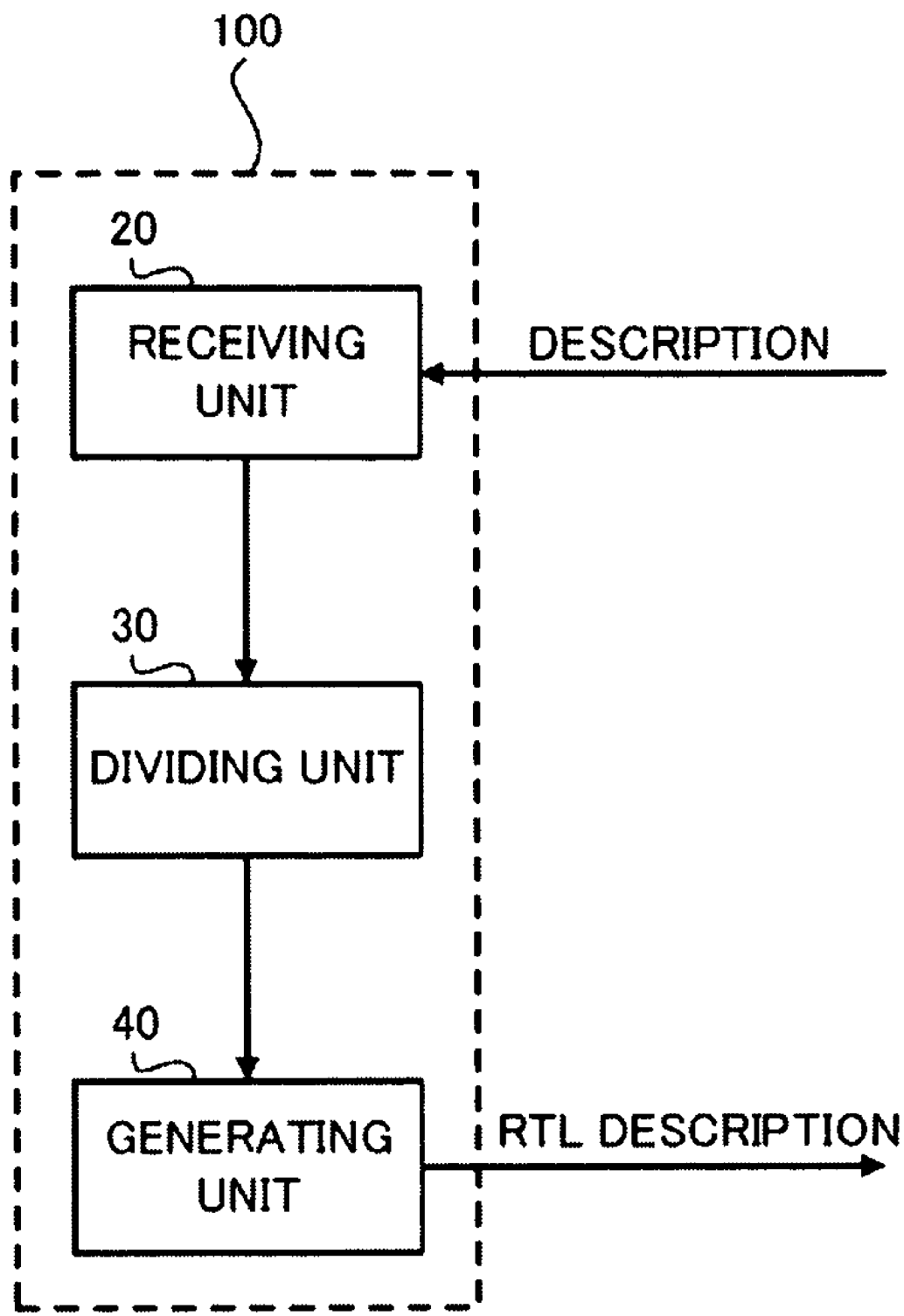
FIG. 2 is a block diagram showing a basic configuration of the description processing device.

FIG. 2 is a block diagram showing the basic configuration of the description processing device 100 according to the present embodiment. As shown in FIG. 2, the description processing device 100 has, in terms of functions, a receiving unit 20, a dividing unit 30, and a generating unit 40.

The receiving unit 20 receives the description expressing the finite state machine comprising the states 0, 1, 2, . . . , N−1. Note that N is the number of the states which can be implemented by the finite state machine and is an integer of 2 or more. The CPU 11 cooperates with the ROM 12, the RAM 13, and the input device 15, thereby realizing the receiving unit 20.

The numbers of the states 0, 1, 2, . . . , N−1 are arbitrarily determined. Therefore, the numbers of the states of the received description may be arbitrarily interchanged, or the numbers can be determined in the received order of the information of the states.

The dividing unit 30 divides the states 0, 1, 2, . . . , N−1 into groups 0, 1, 2, . . . , M−1. Specifically, the dividing unit 30 allocates the states 0, 1, . . . , L[0]−1 to a group 0, allocates the states L[0], L[0]+1, . . . , L[1]−1 to a group 1, allocates the states L[1], L[1]+1, . . . , L[2]−1 to a group 2, . . . , and allocates the states L[M−2], L[M−2]+1, . . . , L[M−1]=N−1 to a group M−1.

Note that M is the number representing how many groups the states are to be divided into, i.e., the number of the groups and is an integer of 2 or more. The CPU 11 cooperates with the ROM 12 and the RAM 13, thereby realizing the dividing unit 30.

As described above, the state numbers can be numbered in an arbitrary order; therefore, no particular limitation is imposed on the division of the states. In the division of a conventional finite state machine, the cut number of transitions has been required to be small; however, such limitation is not-imposed on the present embodiment. Therefore, the present embodiment is different from the conventional techniques in the point that the degree of freedom of the configuration of the groups is high.

The generating unit 40 generates RTL descriptions expressing below constituent elements.

Specifically, the generating unit 40 generates an RTL description expressing a register T storing the information that to which group the current state belongs among the groups 0, 1, 2, . . . , M−1 and a decoder E outputting signals t[0], t[1], t[2], . . . , t[M−1] associated with values which can be stored in the register T, respectively.

The generating unit 40 also generates an RTL description expressing register storing information that to which state the current state belongs among the implementable states of the group and a decoder outputting signals associated with each value that can be stored in the register.

Specifically, the generating unit 40 generates an RTL description expressing a register G[0] storing the information that which one of the states 0, 1, . . . , L[0]−1 is the current state when the current state belongs to the group 0 and a decoder D[0] outputting signals s[0], s[1], . . . , s[L[0]−1]] associated with the each value that can be stored in the register G[0].

The generating unit 40 also generates an RTL description expressing a register G[1] storing the information that which one of the states L[0], L[0]+1, . . . , L[1]−1 is the current state when the current state belongs to the group 1 and a decoder D[1] outputting signals s[L[0]], s[L[0]+1, . . . , s[L[1]−1]] associated with each value that can be stored in the register G[1].

The generating unit 40 also generates an RTL description expressing a register G[2] storing the information that which one of the states L[1], L[1]+1, . . . , L[2]−1 is the current state when the current state belongs to the group 2 and a decoder D[2] outputting signals s[L[1]], s[L[1]+1, . . . , s[L[2]−1]] associated with each value that can be stored in the register G[2].

Similarly, the logic circuit generates RTL descriptions expressing the registers and the decoders corresponding to the groups 3 to M−2, respectively.

Then, the generating unit 40 generates an RTL description expressing a register G[M−1] storing the information that which one of the states L[M−2], L[M−2]+1, . . . , L[M−1]−1=N−1 is the current state when the current state belongs to the group M−1 and a decoder D[M−1] outputting signals s[L[M−2]], s[L[M−2]+1], . . . , s[L[M−1]−1]] associated with each value that can be stored in the register G[M−1].

The generating unit 40 also generates an RTL description expressing a logic circuit outputting signals g[0], g[1], g[L[0]−1]] from respective signals s[0], s[1], . . . , s[L[0]−1]] and the signal t[0], outputting signals g[L[0]], g[L[0]+1], . . . , g[L[1]−1]] from respective signals s[L[0]], s[L[0]+1], . . . , s[L[1]−1]] and the signal t[1], outputting signals g[L[1]], g[L[1]+1], . . . , g[L[2]−1] from respective signals s[L[1]], s[L[1]+1], . . . , s[L[2]−1] and the signal t[2], outputting signals corresponding to the signals output from the decoders corresponding to the groups 3 to M−2, respectively, and outputting signals g[L[M−2]], g[L[M−2]+1], . . . , g[L[M−1]−1] from respective signals s[L[M−2]], s[L[M−2]+1], . . . , s[L[M−1]−1] and the signal t[M−1], thereby outputting the signals g[0], g[1], g[2], . . . , g[N−1] associated with the implementable states 0, 1, 2, . . . , N−1, respectively.

The generating unit 40 also generates an RTL description expressing a transition circuit calculating a next state based on the signals g[0], g[1], g[2], . . . , g[N−1] and storing 0 in the register T and storing the next state in the register G[0] when the next state belongs to the group 0, storing 1 in the register T and storing the next state in the register G[1] when the next state belongs to the group 1, storing 2 in the register T and storing the next state in the register G[2] when the next state belongs to the group 2, also storing a corresponding value in a corresponding register when the next state belongs to any of the groups 3 to M−2, and storing M−1 in the register T and storing the next state in the register G[M−1] when the next state belongs to the group M−1.

Note that the CPU 11 cooperates with the ROM 12 and the RAM 13, thereby realizing the generating unit 40.

Next, description process executed by the description processing device 100 according to the present embodiment will be explained in detail with reference to FIG. 3 and FIG. 4. Note that the explanation will be given on the assumption that the description processing device 100 executes the description process during behavioral synthesis process.

Figure 3:
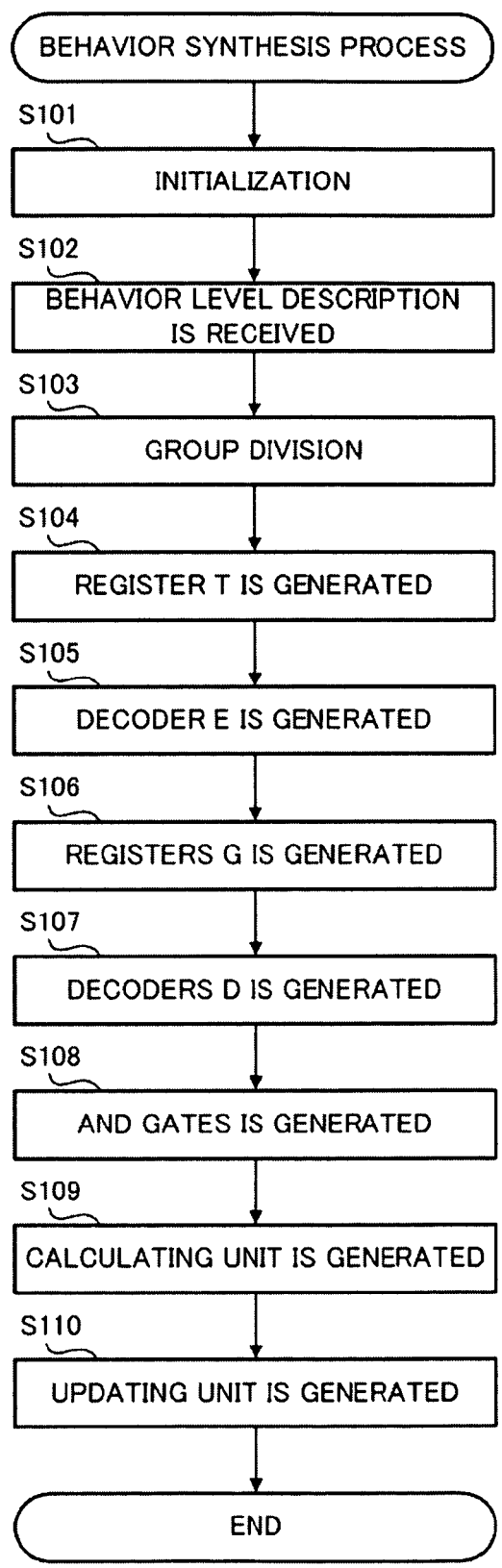
FIG. 3 is a flow chart showing a behavioral synthesis process.

FIG. 3 is a flow chart showing an example of a behavioral synthesis process executed by the description processing device 100. FIG. 4 is a diagram for explaining the finite state machine expressed by the RTL descriptions output by the description processing device 100. The finite state machine has: the transition circuit 200 comprising a calculating unit 210 and an updating unit 220, registers 401 to 416, decoders 501 to 516, AND gates 600 to 663, a register 450, and a decoder 550. Details of the constituent elements that the finite state machine has will be described later.

For example, when an initiation request of behavioral synthesis is received from a user via the input device 15, the description processing device 100 initiates the behavioral synthesis process shown in the flow chart of FIG. 3. Note that FIG. 3 shows merely the process of subjecting the descriptions expressing the finite state machine to behavioral synthesis among behavioral synthesis processes executed by tie description processing device 100.

First, the description processing device 100 executes initialization (step S101). The description processing device 100 initializes the variables which are stored in the RAM 13 and to be used in the behavioral synthesis process.

Then, the receiving unit 20 receives a behavior level description, which is a behavior synthesis target, from the user (step S102). Specifically, the receiving unit 20 receives, from the user, specification of the behavior level description expressing the finite state machine comprising the states 0, 1, 2, . . . , N−1, and retrieves the behavior level description, which is specified by the user, from the hard disk device 14, and stores the description in the RAM 13.

Next, the dividing unit 30 divides the states 0, 1, 2, . . . , N−1, which can be implemented by the finite state machine expressed by the behavior level description received from the user, into the groups 0, 1, 2, . . . , M−1 (step S103). More specifically, the dividing unit 30 allocates the states 0, 1, . . . , L[0]−1 to the group 0, allocates the states L[0], L[0]+1, . . . , L[1]−1 to the group 1, and allocates the states L[1], L[1]+1, . . . , L[2]−1 to the group 2.

Similarly, the dividing unit 30 also allocates states to the groups 3 to M−2. Then, the dividing unit 30 allocates the states L[M−2], L[M−2]+1, . . . , L[M−1]−1=N−1 to the group M−1.

The dividing unit 30 divides (separates) the N states into M groups so that the number of the states which belong to each of the groups is equal as much as possible. Herein, when N is indivisible by M, the number of the states which belong to each of the groups cannot be the same number among all the groups. In this case, the dividing unit 30 carries out the division so that the value of the integer part of the result of division of N by M or the value obtained by adding 1 to the value of the integer part is the number of the states which belong to each of the groups.

The dividing unit 30 determines M in consideration of, for example, the size (area), the processing speed at operation, or the number of implementable states of the circuit to be generated. For example, when it is determined that the size of the circuit to be generated has allowance, the dividing unit 30 increases M; and, when it is determined that it does not have the allowance, the dividing unit 30 reduces M. When it is determined that the processing speed at operation of the circuit to be generated has to be extremely increased, the dividing unit 30 increases M; and, when it is determined that the speed is not required to be increased that much, the dividing unit 30 reduces M. When it is determined that the number of the implementable states of the circuit to be generated is large, the dividing unit 30 increases M; and, when it is determined that the number of the states is not large that much, the dividing unit 30 reduces M.

Figure 4:
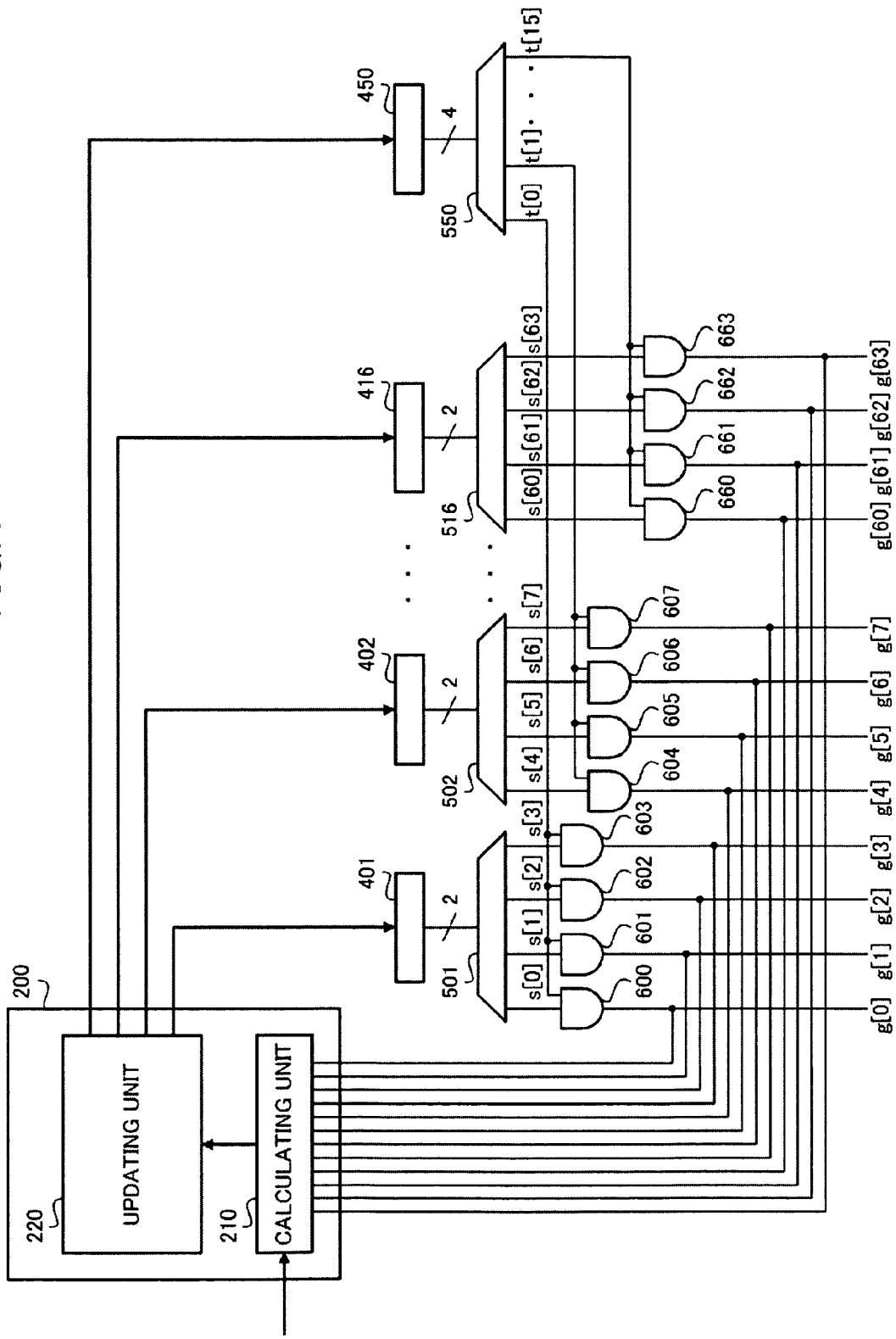
FIG. 4 is a diagram for explaining a finite state machine expressed by RTL descriptions output by the description processing device according to the embodiment of the present invention.

FIG. 4 shows an example of the case in which 64 states (N=64), which can be implemented by the finite state machine, are divided into 16 groups (M=16). In this case, the number of the states which belong to each of the groups is 4. Therefore, the decoder, which is generated to correspond to each of the groups, is merely required to determine tile current state from the four states.

As a comparative example, FIG. 5 shows an example of the case in which the finite state machine comprises one register and one decoder without dividing the 64 states (N=64), which can be implemented by the finite state machine, into groups. In the example shown in FIG. 5, the register 400 stores the 64 states by 6 bits, and the decoder 500 has to determine. the current state from the 64 states based on the value of the 6 bits stored in the register 400.

When tile states, which can be implemented by the finite state machine, are divided into the plurality of groups as described above, the decoder, which is generated to correspond to each of the groups, is merely required to determine the current state from a comparatively small number of states. Therefore, decoding time can be expected to be significantly reduced compared with the case in which merely one decoder is generated to determine the current state from many states.

Next, the generating unit 40 generates a description expressing the register T (hereinafter, referred to as the register 450), which stores the information that to which group the current state belongs among the groups 0, 1, 2, . . . , M–1 (step S104). Hereinafter, in order to facilitate understanding, to generate the description expressing the register 450 will be simply described to generate tile register 450. Similarly, to generate descriptions expressing a decoder E, a register G, a decoder D, an AND gate, the calculating unit 210, and the updating unit 220 will be also simply described to generate the decoder E, the register G, the decoder D, the AND gate, the calculating unit 210, and the updating unit 220.

Then, the generating unit 40 generates the decoder E (hereinafter, referred to as the decoder 550), which outputs the signals t[0], t[1], t[2], . . . , t[M–1] associated with the values stored in the register 450, respectively (step S105). With reference to FIG. 4, the register 450 and the decoder 550 will be explained in detail.

The register 450 stores the value indicating that to which group the current state belongs among the groups 0, 1, 2, . . . , M–1. In the example shown in FIG. 4, since the groups are divided into 16 groups (groups 0 to 15), the register 450 stores any of the values of 0 to 15. The register 450 comprises, for example, a SRAM, which stores 4-bit binary data. Note that the register 450 and the decoder 550 are connected to each other, for example, by a 4-bit data line.

In the example shown in FIG. 4, the decoder 550 outputs a signal (any signal among the signals t[0] to t[15]), which is associated with any of the values of 0 to 15 stored in the register 450, from a signal line corresponding to the signal. For example, when the value stored in the register 450 is "0", the signal level of the signal line corresponding to the signal t[0] is set to the "H level", and all the signal level of the signal lines corresponding to the signals t[1] to t[15] is set to the "L level". For example, when the value stored in the register 450 is "1" the signal level of the signal line corresponding to the signal t[1] is set to the "H level", and all the signal level of the signal lines corresponding to the signal t[0] and the signals t[2] to t[15] is set to the "L level".

Next, the generating unit 40 generates the number of the groups (M units) of the registers G storing the information that which state is the current state among the implementable states of the group to which the current state belongs (step S106). Hereinafter, the registers G, which are generated so as to be associated with the groups 0 to M–1, respectively, will be referred to as the registers 401 to 416.

The generating unit 40 also generates the number of the groups (M units) of the decoders D outputting the signals corresponding to respective values stored in the register G (step S107). Hereinafter, the decoders D, which are generated so as to correspond to the groups 0 to M–1 respectively, will be referred to as the decoders 501 to 516.

The generating unit 40 also generates the number of the implementable states of the finite state machine (N units) of AND gates carrying out the AND operation of the signal level of any of the signals output from any of the decoders among the decoders 501 to 516 and the signal level of any of the signals output from the decoder 550 (step S108). Hereinafter, the AND gates, which are generated so as to respectively correspond to the states 0 to N–1 respectively, will be referred to as AND gates 600 to 663.

Hereinafter, with reference to FIG. 4, the registers 401 to 416, the decoders 501 to 516, and the AND gates 600 to 663 will be explained in detail. First, the register 401, the decoder 501, and the AND gates 600 to 603, which are generated so as to correspond to the group 0, will be explained. the current state is any of the states 0 to 3

When the current state belongs to the group 0 (in other words, when the current state is any of the states 0 to 3), the register 401 stores the information that which one of the states 0 to 3 is the current state as any of the values 0 to 3. The register 401 comprises, for example, a SRAM storing 2-bit binary data. The register 401 and the decoder 501 are connected to each other, for example, by a 4-bit data line.

The decoder 501 outputs the signal (any of the signals s[0] to s[3]), which is corresponding to any of the values of 0 to 3 stored in the register 401 from the signal line, which is corresponding to the signal. For example, when the value stored in the register 401 is "0", the signal level of the signal line, which is corresponding to the signal s[0], is set to the "H level", and all the signal level of the signal lines corresponding to the signals s[1] to s[3] respectively, is set to the "L level". For example, when the value stored in the register 401 is "1", the signal level of the signal line corresponding to the signal s[1], is set to the "H level", and all the signal level of the signal lines corresponding to the signals s[0], s[2], and s[3] respectively, is set to the "L level".

The AND gate 600 carries out the AND operation of the signal level of the signal s[0], which is supplied from the decoder 501, and the signal level of the signal t[0], which is supplied from the decoder 550. Then, the AND gate 600 sets the signal level of the signal line corresponding to the signal g[0], to the signal level indicated by the obtained AND operation. For example, merely when the signal level of the signal s[0] is the "H level" and the signal level of the signal t[0] is the "H level", the signal level of the signal line corresponding to the signal g[0], is set to the "H level". For example, when either one of the signal level of the signal s[0] and the signal level of the signal t[0] is the "L level", the signal level of the signal line corresponding to the signal g[0], is set to the "L level".

As well as the AND gate 600, the AND gates 601 to 603 carry out the AND operations of the signal level of the respective signals s[1] to s[3], which are supplied from the decoder 501, and the signal level of the signal t[0], which is supplied from the decoder 550. Then, the AND gates 601 to 603 set the signal level of the signal lines, corresponding to the signals g[1] to g[3] respectively, to the signal level indicated by the AND operations obtained respectively.

Next, the register 402, the decoder 502, and the AND gates 604 to 607, which are generated so as to correspond to the group 1, will be explained.

When the current state belongs to the group 1 (in other words, when the current state is any of the states 4 to 7), the register 402 stores the information that which one of the states 4 to 7 is the current state as any of the values 0 to 3. The register 402 comprises, for example, a SRAM storing 2-bit binary data. The register 402 and the decoder 502 are connected to each other, for example, by a 4-bit data line.

The decoder 502 outputs the signal (any signal of the signals s[4] to s[7]) corresponding to any of the values of 0 to 3 stored in the register 402 from the signal line corresponding to the signal. For example, when the value stored in the register 402 is "0", the signal level of the signal line corresponding to the signal s[4], is set to the "H level", and all the signal level of the signal lines corresponding to the signals s[5] to s[7], is set to the "L level". For example, when the value stored in the register 402 is "1", the signal level of the signal line corresponding to the signal s[5], is set to the "H level", and all the signal level of the signal lines corresponding to the signals s[4], s[6], and s[7] respectively, is set to the "L level".

The AND gate 604 carries out the AND operation of the signal level of the signal s[4], which is supplied from the decoder 502, and the signal level of the signal t[1], which is supplied from the decoder 550. Then, the AND gate 604 sets the signal level of the signal line corresponding to the signal g[4], to the signal level indicated by the obtained AND operation. For example, merely when the signal level of the signal s[4] is the "H level" and the signal level of the signal t[1] is the "H level", the signal level of the signal line corresponding to the signal g[4], is set to the "H level". For example, when either one of the signal level of the signal s[5] and the signal level of the signal t[1] is the "L level", the signal level of the signal line corresponding to the signal g[5], is set to the "L level".

As well as the AND gate 604, the AND gates 605 to 607 carry out the AND operations of the signal level of the respective signals s[5] to s[7], which are supplied from the decoder 502, and the signal level of the signal t[1], which is supplied from the decoder 550. Then, the AND gates 605 to 607 set the signal level of the signal lines, corresponding to the signals g[5] to g[7] respectively, to the signal level indicated by the respectively obtained AND operations.

The registers 403 to 416, the decoders 503 to 516, and the AND gates 608 to 663, which are generated so as to correspond to the groups 2 to 15 respectively, are also operated in a similar manner.

Next, the generating unit 40 generates the calculating unit 210, which calculates the next state based on the signals g[0] to g[N−1] (step S109). The calculating unit 210 obtains the current state from the signals g[0] to g[N−1]. Specifically, the calculating unit 210 obtains, as the current state, the state corresponding to the signal that is determined to have the signal level of the "H level" among the signals g[0] to g[N−1].

The calculating unit 210 also calculates the next state in response to a state update order signal, which orders to change the current state to the next state. The state update order signal is a signal which orders the updating timing of the state and corresponds to, for example, a clock signal. When the next state is to be determined based on the current state, order input by the user, elapse of time, etc., the information such as the order input by the user and the current time may be provided as part of the state update order signal. When the state update order signal is the signal which orders merely the updating timing of the state, the calculating unit 210 obtains the next state, which is determined in advance, from the current state.

Next, the generating unit 40 generates the updating unit 220 which stores the value, which indicates the group to which the next state belongs, in the register 450 and stores the value, which indicates the next state, in the register, which is corresponding to the group to which the next state belongs among the registers 401 to 416 (step S110).

Hereinafter, with reference to FIG. 4, the calculating unit 210 and the updating unit 220 will be explained by showing specific examples. First, the case in which the state update order signal supplied to the calculating unit 210 is the signal which orders merely the updating timing of the state will be explained.

In response to the state update order signal, the calculating unit 210 determines all the signal levels of the signals g[0] to g[63]. For example, when the calculating unit 210 determines that the signal level of the signal g[3] is the "H level" and that all the signal levels of the other signals are the "L level", the calculating unit 210 recognizes that the current state is the state 3. Then, the calculating unit 210 obtains the state 4 as the state advanced from the current state by one and sets the state 4 as the next state.

In response to supply of a signal, which indicates that the next state is the state 4, from the calculating unit 210, the updating unit 220 obtains the group to which the state 4 belongs. When the updating unit 220 determines that the group to which the state 4 belongs is the group 1, the updating unit 220 stores 1 in the register 450 as the value indicating that the group is the group 1. The updating unit 220 also stores 0 in the register 402, which is corresponding to the group 1, as the value indicating that the state is the state 4. In this manner, the updating unit 220 stores, in the register, the difference of the number of the next state and the number of the state having the smallest number among the states belonging to the group.

Next, the case in which the state update order signal supplied to the calculating unit 210 is the signal which directly orders the next state in addition to the updating timing of the state will be explained.

In response to the state update order signal, the calculating unit 210 recognizes the next state which is ordered by the state update order signal. For example, when the state 5 is ordered as the next state by the state update order signal, the calculating unit 210 sets the state 5 as the next state regardless of the signal level of the signals g[0] to g[63].

In response to supply of a signal, which is indicating that the next state is the state 5, from the calculating unit 210, the updating unit 220 obtains the group to which the state 5 belongs. When the updating unit 220 determines that the group to which the state 5 belongs is the group 1, the updating unit 220 stores 1 in the register 450 as the value indicating that the group is the group 1. The updating unit 220 also stores 1 in the register 402, which is corresponding to the group 1, as the value indicating that the state is the state 5.

When the generating unit 40 generates the updating unit 220, the behavior synthesis process is completed.

In the description processing device 100 according to the present embodiment, the N states which can be implemented by the finite state machine are divided into M groups, the decoders are generated for each group and decoding is carried out for each group. Therefore, compared with the case in which merely one decoder is generated to decode all the states by the one decoder, the number of the states which have to be determined by one decoder can be reduced. Therefore, the time taken for decoding by the finite state machine can be shortened.

Moreover, the dividing unit 30 carries out division so that the value of the integer part of the result obtained by dividing N by M or the value obtained by adding 1 to the integer part is the number of the states belonging to each of the groups. Therefore, the maximum difference of the number of the states, which belong to each of the groups, from that of the other groups is 1. Therefore, the time taken for decoding can be uniformed among the groups.

In the above described embodiment, the receiving unit 20 received the behavior level description; however, for example, an intermediate description obtained from the behavior level description in the process of generating an RTL description may be received. When the received intermediate description is a description in which a finite state machine comprises one register and one decoder, the RTL description is generated by dividing the one register and the one decoder into a plurality of registers and a plurality of decoders, respectively.

In the above described embodiment, the explanations have been given on the assumption that a program is stored in the memory device in advance. However, the program for operating the description processing devices as the entirety or part of a device or for executing the above described processes may be distributed in the state that it is stored in a computer-readable recording medium such as a Compact Disk Read-Only Memory (CD-ROM), Digital Versatile Disk (DVD), or Magneto Optical Disk (MO); and the program may be installed to another computer so as to be operated as means of the above description or caused to execute above described steps.

Furthermore, the program may be stored in, for example, a disk device owned by a server device on the Internet, and the program may be executed by, for example, downloading the program to a computer by, for example, superimposing the program on a carrier wave.

As described above, according to the present invention, the description processing device, the description processing method suitable for realizing the electronic circuit, which acquires the current state of the finite state machine at a high speed, and a recording medium recording program for realizing them on a computer can be provided.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A description processing device comprising:
a receiving unit receiving a description expressing a finite state machine comprising states $0, 1, 2, \ldots, N-1$;
a dividing unit dividing the states $0, 1, 2, \ldots, N-1$ into groups $0, 1, 2, \ldots, M-1$,
the dividing unit
allocating the states $0, 1, \ldots, L[0]-1$ to the group 0,
allocating the states $L[0], L[0]+1, \ldots, L[1]-1$ to the group 1,
allocating the states $L[1], L[1]+1, \ldots, L[2]-1$ to the group 2,
..., and
allocating the states $L[M-2], L[M-2]+1, \ldots, L[M-1]-1=N-1$ to the group $M-1$; and
a generating unit generating a register transfer level description, wherein
the register transfer level description expresses:
(a) a register T storing information regarding to which group a current state belongs among the groups $0, 1, 2, \ldots, M-1$ and a decoder E outputting signals $t[0], t[1], t[2], \ldots, t[M-1]$ corresponding to each value that can be stored in the register T;
(b) a register G[0] storing information regarding which one of the states $0, 1, \ldots, L[0]-1$ is the current state when the current state belongs to the group 0 and a decoder D[0] outputting signals $s[0], s[1], \ldots, s[L[0]-1]]$ corresponding to each value that can be stored in the register G[0],
a register G[1] storing information regarding which one of the states $L[0], L[0]+1, \ldots, L[1]-1$ is the current state when the current state belongs to the group 1 and a decoder D[1] outputting signals $s[L[0]], s[L[0]+1-], \ldots, s[L[1]-1]]$ corresponding to each value that can be stored in the register G[1],
a register G[2] storing information regarding which one of the states $L[1], L[1]+1, \ldots, L[2]-1$ is the current state when the current state belongs to the group 2 and a decoder D[2] outputting signals $s[L[1]], s[L[1]+1], \ldots, s[L[2]-1]$ corresponding to each value that can be stored in the register G[2],
..., and
a register G[M-1] storing information regarding which one of the states $L[M-2], L[M-2]+1, \ldots, L[M-1]-1=N-1$ is the current state when the current state belongs to the group $M-1$ and a decoder D[M-1] outputting signals $s[L[M-2]], s[L[M-2]+1], \ldots, s[L[M-1]-1]$ corresponding to each value that can be stored in the register G[M-1];
a logic circuit
outputting signals $g[0], g[1], \ldots, g[L[0]-1]]$ from the respective signals $s[0], s[1], \ldots, s[L[0]-1]]$ and the signal $t[0]$,
outputting signals $g[L[0]], g[L[0]+1], \ldots, g[L[1]-1]]$ from the respective signals $s[L[0]], s[L[0]+1], \ldots, s[L[1]-1]]$ and the signal $t[1]$,
outputting signals $g[L[1]], g[L[1]+1], \ldots, g[L[2]-1]$ from the respective signals $s[L[1]], s[L[1]+1], \ldots, s[L[2]-1]$ and the signal $t[2]$,
..., and
outputting signals $g[L[M-2]], g[L[M-2]+1], \ldots, g[L[M-1]-1]$ from the respective signals $s[L[M-2]], s[L[M-2]+1], \ldots, s[L[M-1]-1]$ and the signal $t[M-1]$
so as to output the signals $g[0], g[1], g[2], \ldots, g[N-1]$ corresponding to each implementable states $0, 1, 2, \ldots, N-1$; and
a transition circuit calculating a next state based on the signals g[0], g[1], g[2], . . . , g[N−1] and storing 0 in the register T and the next state in the register G[0] when the next state belongs to the group 0, storing 1 in the register T and the next state in the register G[1] when the next state belongs to the group 1, storing 2 in the register T and the next state in the register G[2] when the next state belongs to the group 2, . . . , and storing M−1 in the register T and the next state in the register G[M−1] when the next state belongs to the group M−1.

2. The description processing device according to claim 1, wherein each of L[0], L[1]−L[0], L[2]−L[1], . . . , L[M−1]−L[M−2] is a value of an integer part of a result of dividing N by M or a value obtained by adding 1 to the value of the integer part.

3. A description processing method executed by a description processing device comprising a receiving unit, a dividing unit, and a generating unit, the method including:

a receiving step of receiving a description expressing a finite state machine comprising states 0, 1, 2, . . . , N−1 by the receiving unit;

a dividing step of dividing the states 0, 1, 2, . . . , N−1 into groups 0, 1, 2, . . . , M−1 by the dividing unit, the dividing step allocating the states 0, 1, . . . , L[0]−1 to the group 0, allocating the states L[0], L[0]+1, . . . , L[1]−1 to the group 1, allocating the states L[1], L[1]+1, . . . , L[2]−1 to the group 2, . . . , and allocating the states L[M−2], L[M−2]+1, . . . , L[M−1]−1=N−1 to the group M−1; and a generating step of generating a register transfer level description by the generating unit, wherein the register transfer level description expresses:

(a) a register T storing information regarding to which group a current state belongs among the groups 0, 1, 2, . . ., M−1 and a decoder E outputting signals t[0], t[1], t[2], . . . , t[M−1] corresponding to each value that can be stored in the register T;

(b) a register G[0] storing information regarding which one of the states 0, 1, . . . , L[0]−1 is the current state when the current state belongs to the group 0 and a decoder D[0] outputting signals s[0], s[1], . . . , s[L[0]−1]] corresponding to each value that can be stored in the register G[0], a register G[1] storing information regarding which one of the states L[0], L[0]+1, . . . , L[1]−1 is the current state when the current state belongs to the group 1 and a decoder D[1] outputting signals s[L[0]], s[L[0]+1], . . . , s[L[1]−1]] corresponding to each value that can be stored in the register G[1], a register G[2] storing information regarding which one of the states L[1], L[1]+1, . . . , L[2]−1 is the current state when the current state belongs to the group 2 and a decoder D[2] outputting signals s[L[1]], s[L[1]+1], . . . , s[L[2]−1] corresponding to each value that can be stored in the register G[2], . . . , and a register G[M−1] storing information regarding which one of the states L[M−2], L[M−2]+1, . . . , L[M−1]−1=N−1 is the current state when the current state belongs to the group M−1 and a decoder D[M−1] outputting signals s[L[M−2]], s[L[M−2]+1], . . . , s[L[M−1]−1] corresponding to each values which can be stored in the register G[M−1];

a logic circuit outputting signals g[0], g[1], . . . , g[L[0]−1]] from the respective signals s[0], s[1], . . . , s[L[0]−1]] and the signal t[0], outputting signals g[L[0]], g[L[0]+1], . . . , g[L[1]−1]] from the respective signals s[L[0]], s[L[0]+1], . . . , s[L[1]−1]] and the signal t[1], outputting signals g[L[1]], g[L[1]+1], . . . , g[L[2]1] from the respective signals s[L[1]], s[L[1]+1], . . . , s[L[2]−1] and the signal t[2], . . . , and outputting signals g[L[M−2]], g[L[M−2]+1], . . . , g[L[M−1]−1] from the respective signals s[L[M−2]], s[L[M−2]+1], . . . , s[L[M−1]−1] and the signal t[M−1]

so as to output the signals g[0], g[1], g[2], . . . , g[N−1] corresponding to each implementable state 0, 1, 2, . . . , N−1; and a transition circuit calculating a next state based on the signals g[0], g[1], g[2], . . . , g[N−1] and storing 0 in the register T and the next state in the register G[0] when the next state belongs to the group 0, storing 1 in the register T and the next state in the register G[1] when the next state belongs to the group 1, storing 2 in the register T and the next state in the register G[2] when the next state belongs to the group 2, . . . , and storing M−1 in the register T and the next state in the register G[M−1] when the next state belongs to the group M−1.

4. A non-transitory recording medium recording a program causing a computer to function as:

a receiving unit receiving a description expressing a finite state machine comprising states 0, 1, 2, . . . , N−1;

a dividing unit dividing the states 0, 1, 2, . . . , N−1 into groups 0, 1, 2, . . . , M−1, the dividing unit allocating the states 0, 1, . . . , L[0]−1 to the group 0, allocating the states L[0], L[0]+1, . . . , L[1]−1 to the group 1, allocating the states L[1], L[1]+1, . . . , L[2]−1 to the group 2, . . . , and allocating the states L[M−2], L[M−2]+1, . . . , L[M−1]−1=N−1 to the group M−1; and a generating unit generating a register transfer level description, wherein the register transfer level description expresses:

(a) a register T storing information regarding to which group a current state belongs among the groups 0, 1, 2, . . . , M−1 and a decoder E outputting signals t[0], t[1], t[2], . . . , t[M−1] corresponding to each value that can be stored in the register T;

(b) a register G[0] storing information regarding which one of the states 0, 1, . . . , L[0]−1 is the current state when the current state belongs to the group 0 and a decoder D[0] outputting signals s[0], s[1], . . . , s[L[0]−1]] corresponding to each value that can be stored in the register G[0], a register G[1] storing information regarding which one of the states L[0], L[0]+1, . . . , L[1]−1 is the current state when the current state belongs to the group 1 and a decoder D[1] outputting signals s[L[0]], s[L[0]+1], . . . , s[L[1]−1]] corresponding to each value that can be stored in the register G[1], a register G[2] storing information regarding which one of the states L[1], L[1]+1, . . . , L[2]−1 is the current state when the current state belongs to the group 2 and a decoder D[2] outputting signals s[L[1]], s[L[1]+1], . . . , s[L[2]−1] corresponding to each value that can be stored in the register G[2], . . . , and a register G[M−1] storing information regarding which one of the states L[M−2], L[M−2]+1, . . . , L[M−1]−1=N−1 is the current state when the current state belongs to the group M−1 and a decoder D[M−1] outputting signals s[L[M2]], s[L[M−2]+1], . . . , s[L[M−1]−1] corresponding to each value that can be stored in the register G[M−1];

a logic circuit outputting signals g[0], g[1], . . . , g[L[0]−1]] from the respective signals s[0], s[1], . . . , s[L[0]−1]] and the signal t[0], outputting signals g[L[0]], g[L[0]+1], . . . , g[L[1]−1]] from the respective signals s[L[0]], s[L[0]+1], . . . , s[L[1]−1]] and the signal t[1], outputting signals g[L[1]], g[L[1]+1], . . . , g[L[2]−1] from the respective signals s[L[1]], s[L[1]+1], . . . , s[L[2]−1] and the signal t[2], . . . , and outputting signals g[L[M−2]], g[L[M−2]+1], . . . , g[L[M−1]−1] from the respective signals s[L[M−2]], s[L[M−2]+1], . . . , s[L[M1]−1] and the signal t[M−1]

so as to output the signals g[0], g[1], g[2], . . . , g[N−1] corresponding to each implementable state 0, 1, 2, . . . , N−1; and a transition circuit calculating a next state based on the signals g[0], g[1], g[2], . . . , g[N−1] and storing 0 in the register T and the next state in the register G[0] when the next state belongs to the group 0, storing 1 in the register T and the next state in the register G[1] when the next state belongs to the group 1, storing 2 in the register T and the next state in the register G[2] when the next state belongs to the group 2, . . . , and storing M−1 in the register T and the next state in the register G[M−1] when the next state belongs to the group M−1.

* * * * *